United States Patent
Shyu

(10) Patent No.: US 6,612,505 B2
(45) Date of Patent: Sep. 2, 2003

(54) SPRAYING METHOD OF A DISPENSE SYSTEM

(75) Inventor: Ching-Shyong Shyu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 153 days.

(21) Appl. No.: 09/882,149

(22) Filed: Jun. 15, 2001

(65) Prior Publication Data
US 2002/0153427 A1 Oct. 24, 2002

(30) Foreign Application Priority Data

Apr. 20, 2001 (TW) ........................................ 90109497 A

(51) Int. Cl.[7] .............................. B05B 17/04; B05B 1/30
(52) U.S. Cl. .............................. 239/11; 239/1; 239/104; 239/106; 239/119; 239/569; 239/574; 222/571
(58) Field of Search ................................ 239/1, 11, 104, 239/106, 119, 124, 569, 574; 222/571

(56) References Cited

U.S. PATENT DOCUMENTS

| | | | | |
|---|---|---|---|---|
| 4,004,717 A | * | 1/1977 | Wanke | 222/571 |
| 6,024,249 A | * | 2/2000 | On | 222/52 |
| 6,332,924 B1 | * | 12/2001 | Shim et al. | 239/119 |
| 6,431,258 B1 | * | 8/2002 | Konishi et al. | 165/46 |
| 6,539,986 B2 | * | 4/2003 | Yajima | 141/2 |

* cited by examiner

*Primary Examiner*—Robin O. Evans
(74) *Attorney, Agent, or Firm*—J. C. Patents

(57) ABSTRACT

A spraying method of a dispense system for preventing residue, wherein a precise amount of stream fluid is supplied from a fluid supply through a main tube to a nozzle, and the precise amount of stream fluid is sprayed onto a surface of a wafer. A sub-tube system, which comprises a bypass valve and a pin hole is utilized to refill the fluid to a void. A metering valve is used as a suck-back system to retrieve the remaining fluid in the main tube and prevent residue from occurring.

9 Claims, 1 Drawing Sheet

SPRAYING METHOD OF A DISPENSE SYSTEM

CROSS-REFERENCE TO RELATED APPLICATION

This application claims the priority benefit of Taiwan application Ser. No. 90/109,497, filed Apr. 20, 2001.

BACKGROUND OF THE INVENTION

1. Field of Invention

The present invention relates generally to a spraying method of a dispense system. More particularly, the present invention relates to a spraying method of a dispense system that can prevent residue from occurring.

2. Description of the Related Art

The inventive method is applied in a post develop dispense (PDD) process to serve as an example in order to describe the inventive technique.

The fundamental processes of photolithography consist of coating, exposing and developing. In a common use such as a positive photoresist type, the main characteristic of the positive photoresist is to utilize a chemical reaction between a developer and an exposed photoresist layer on a wafer in order to remove the photoresist layer. The unexposed photoresist layer is defined by patterning. In order to have an in-line type of fabrication, a spray/puddle method is generally used for the photolithography fabrication. The spray/puddle method comprises spraying the developer from a spinner onto a surface of a wafer. While the wafer is in a stationary status, a puddle process is carried out. Further, after cleaning the wafer with pure water, a spin-dry process is followed to dry the wafer. Thus the photolithography process is completed.

However, in the above-described process, a portion of the photoresist layer is etched improperly during the etching process. Thus, for a high-density product, a PDD process is added after the photolithography process. The PDD process is carried out before cleaning the wafer. When the wafer is spinning on a machine, a certain amount of developer is sprayed onto the surface of the wafer in a short period. By utilizing the etching effect of the developer plus the spinning force, the portion of improperly etched photoresist layer can be re-etched and cleaned. The cleaning process is carried out by spraying pure water onto the wafer to wash away the residue and developer, and next the spinning-dry process is carried out to dry the wafer.

In the present industrial technology, the above-mentioned photolithography process is carried out automatically by an automatic machine with a mechanical arm. Since the machine is utilized for several steps of the photolithography process, the mechanical arm will return to its home position after completing a spraying process of the developer. The remaining fluid of the developer in the tube will drop onto the wafer due to the movement of the mechanical arm. Since the cleaning process of the PDD process is already completed, the excess drops of developer on the wafer will cause a portion of the wafer to be over-developed.

A conventional method of solving the problem of excess developer is to supply a certain amount of developer during a short period. A suck back process is carried out after the developer supply is switched off, and the remaining fluid in the tube is suck backed by a suck-back valve. However, a capillarity effect will cause a void to occur when the fluid supply is closed rapidly. That is, when the suck back valve retrieves the fluid back, the void and some drops of the developer that are still adhered on the inner surface of the tube will occur in the tube. Those excess drops of developer will either fall onto the wafer or dry out into residue, which can block off the flow of the fluid in the tube. The excess developer can also cause a portion of the wafer to be over-developed.

The portion of the wafer that is over-developed can not be inspected by human eyes. Thus, the defected wafer is usually carried to the next step of the process. During the etching process, the etching reaction in the over-developed portion is aggravated and cannot be controlled, consequently damaging the whole wafer and increasing the production cost.

SUMMARY OF THE INVENTION

The present invention provides a spraying method of a dispense system that can prevent the formation of residue. The dispense system of the present invention utilizes a buffer tube with a pin hole to refill a void and prevents fluid from adhering on the inner surface of the tube. The buffer tube supplies the fluid through the pin hole to the void because the pin hole has a very small diameter; thus, the void is refilled slowly with a very small amount. Once the level of the fluid reaches a certain level, the main tube will stop supplying the fluid, and a suck back valve will open to suck back the fluid very slowly so that no void or fluid will adhere on the inner surface. Thus, no residue will form, and no excess fluid will fall onto the wafer.

The present invention further provides a main valve together with the suck back valve to supply the developer to the wafer, wherein the main valve and the suck back valve can control a precise amount of developer that is sprayed onto the wafer. The buffer tube further comprises a buffer valve, which is utilized together with the pin hole to refill the void formed in the tube in such a manner that the void can be refilled. No residue forms on the tube, and no excess developer falls onto the wafer. Furthermore, the present invention can accurately control the precise amount of developer that is sprayed onto the wafer.

Both the foregoing general description and the following detailed description are exemplary and explanatory only and are not restrictive of the invention as claimed.

DESCRIPTION OF THE PREFERRED EMBODIMENTS

Figure 1:
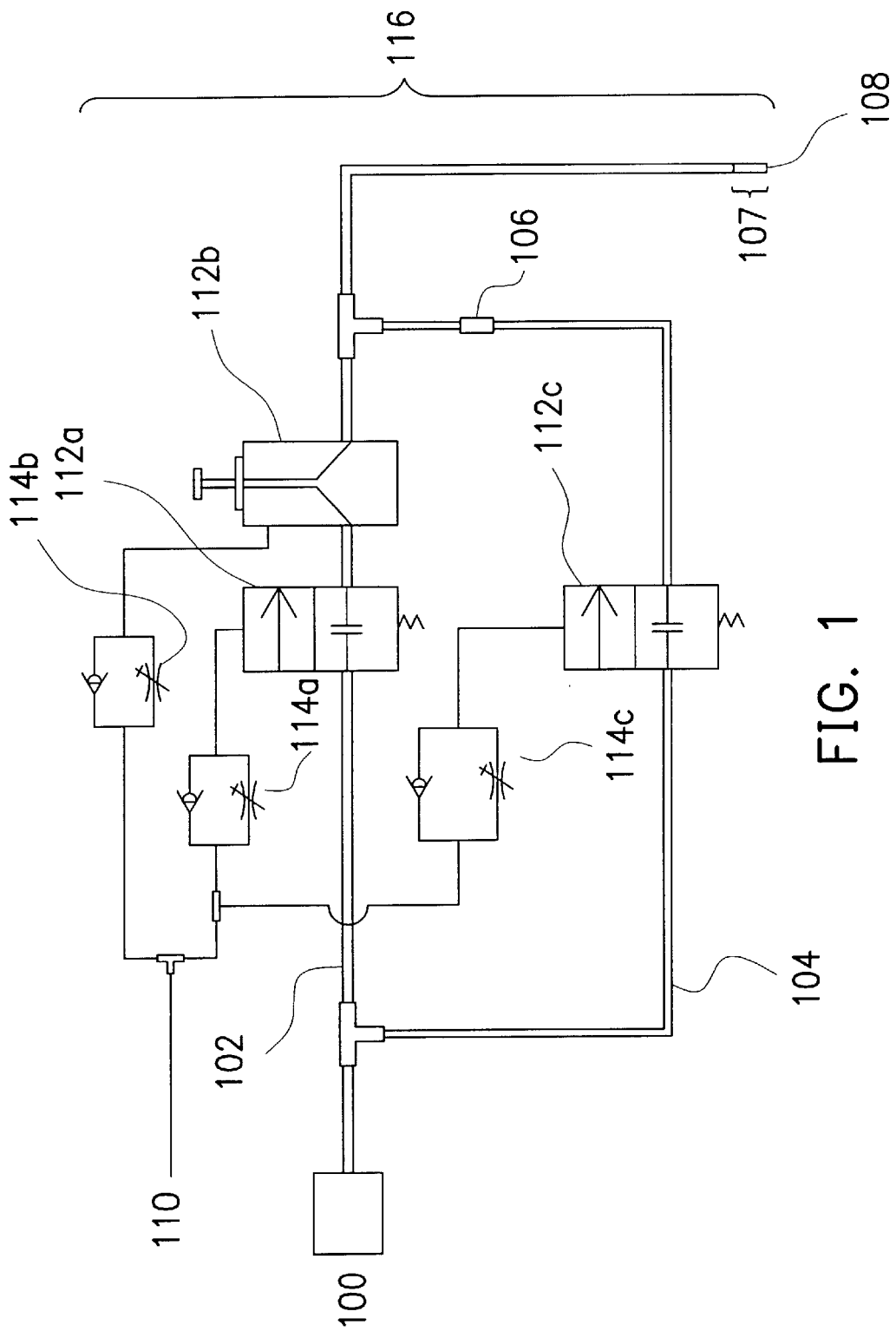
FIG. 1 illustrates a diagrammatic view of a dispense system that can prevent residue in accordance with a preferred embodiment of the present invention.

FIG. 1 illustrates a cross-sectional view of a dispense system for preventing residue in accordance with a preferred embodiment of the present invention. A dispense system 116, which is utilized to spray a stream liquid on a wafer comprises: a compressed air supplier 110, a fluid supplier 100, a main tube 102, a main valve 112*a*, a suck back valve 112*b*, a main speed controller 114*a* and a suck back speed controller 114*b*.

A post develop dispense (PDD) process has been used as an example in the preferred embodiment in order to explain the technique of the present invention. A stream of developer is used; thus the fluid supplier 100 stores and supplies developer to the whole nozzle system. The fluid supplier 100 is connected to one end of the main tube 102, and the other end of the main tube 102 is connected to a main nozzle 108 such as a stream nozzle, which sprays stream developer onto the surface of the wafer. The main valve 112a and the suck-back valve 112b are both connected respectively to the main tube 102a and the compressed air supplier 110. The main speed controller 114a and the suck back speed controller 114b are connected respectively to the main valve 112a and the suck-back valve 112b. All the speed controllers and valves are connected to the compressed air supplier 110, so that compressed air can be supplied to trigger the switches of these valves and controller in order to control and maintain the flow rate and the flow volume of the developer.

The dispense system 116 further comprises a buffer tube 104, which has a pin hole 106 (shown in FIG. 1) that is connected to the main tube 102. The pin hole 106, which is made of teflon, has a diameter range of approximately between 0.4 mm to 0.8 mm but is preferably 0.6 mm for the present invention. The pin hole 106 controls the flow volume from the buffer tube 104 to the main tube 102. A buffer valve 112c and a buffer speed controller 114c are located at the buffer tube 104, and the compressed air is supplied to the buffer valve 112c and the buffer speed controller 114c in order to control the flow rate and volume in the buffer tube 104.

In FIG. 1, the stream developer is transmitted from the fluid supplier 100 through the main tube 102 to the main nozzle 108. The stream developer is then sprayed out from the main nozzle 108 onto the wafer. The fluid supplier 100 utilizes a predetermined pressure to supply the stream developer to the main tube 102. The volume and flow rate of the stream developer in the main tube 102 are controlled by the main valve 112a and the main speed controller 114a which are both triggered by the compressed air. After a predetermined volume, the main valve 112a is triggered to switch off the supply from the main tube 102. The switch off action of the main valve 112a can be very rapid and short, so that a precise amount of developer is sprayed onto the wafer. But a suddenly drop of pressure in the main tube takes place due to the rapid closing action; thus a void 107 is formed at the end of the main tube 102 by the capillarity effect. The volume of the void 107 is approximately between 1 ml to 3 ml in accordance with the developer used in the present invention. However, the void volume 107 can be changed by various factors. For example, different types of fluid or different diameters of tubes can affect the volume of void 107.

When a void 107 occurs, some drops of the developer will adhere onto the internal surface of the main tube 102 due to the surface tension effect. These drops either drop out eventually from the main nozzle onto the wafer or dry out to become residue. Since the volume of the developer that is sprayed onto the wafer is critical in this PDD process, any excess drops of the developer can affect the developing process. The excess developer on the surface of the wafer can turn to residue. The quality of the wafer is affected, and the wafer is damaged. The diameter of the tube is also too small to be cleaned easily, and any residue adhered on the inner surface can block off the stream flow and affect the flow quantity. The reliability of the whole process is thus reduced.

The present invention provides a spraying method of preventing the residue from occurring. The steps of the method comprise:

1. The stream developer is supplied from the fluid supplier 100 through the main tube 102 to the main valve 112a and then to the suck back valve 112b, wherein the suck back valve 112b controls the volume of the stream developer. A pressure of approximately 1.0 kg/cm$^2$ is utilized to supply the stream developer from the fluid supplier 100 to the main tube 102. Once the stream developer reaches a precise level at the suck back valve 112b, the main valve 112a is triggered to switch off the supply from the fluid supplier 100, so that the volume of the stream developer is always maintained at a precise amount. The precise amount of the stream developer is supplied from the suck back valve 112b through the main tube 102 to the main nozzle 108, and the stream developer is sprayed from the nozzle onto the surface of the wafer.

2. When the precise amount of the stream developer is sprayed out onto the wafer, the suck back valve 112b is triggered to switch off. Because of the rapid closing action and the capillarity effect, the void 107 is formed at the end of the main tube 102. At this stage, the buffer valve 112c is triggered to open and supply a predetermined amount of developer through the buffer tube 104 and the pin hole 106 to the void 107. The buffer tube 104 has a smaller diameter than the main tube 102, and the pin hole has a diameter preferably of only 0.6 mm. The purpose of the pin hole 106 is to allow tiny drops of developer to fill into the void 107 slowly, so that the amount of the stream developer in the tube can be controlled and the stream developer will not drop out from the tube onto the wafer. The void 107 can be formed approximately between 1 ml to 3 ml in accordance with the preferred embodiment of the present invention.

3. The void 107 is refilled to a certain level at the main tube 102 on which those drops of developer adhered thereon are retrieved, and the buffer valve 112c is triggered to switch off the supply. The suck back valve 112b is then triggered to open and suck back stream developer slowly from the main tube 102, wherein the developer is suck backed to a certain level approximately between 3 ml to 6 ml away from the main nozzle 108. Therefore, the void effect in the tube is solved and no residue will occur in the tube. The quality and reliability of the fabrication process are improved.

The present invention provides a spraying method of a dispense system, which can prevent the residue inside a tube or on a wafer. The flow volume and flow rate of the fluid in the tube can be controlled accurately, and the amount of spraying fluid can be controlled to a precise volume. The present invention further provides a buffer tube system with a buffer valve solving a void problem and preventing residue from occurring. Thus the quality and the reliability of the production process are improved.

Although a developer fluid and a PDD process have been used as an example in the above-described preferred embodiment, the present invention is not limited to this but may be any type of fluid. The present invention also is not limited to the PDD process but could be used for various processes to prevent residue.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of a dispense system, for preventing residue, wherein the steps of the method comprise:

performing a spray process, wherein a precise amount of stream fluid is supplied from a fluid supply through a main tube to a nozzle, wherein when the spray process stops, a void is formed at an end of the main tube;

performing a refilling process, wherein the fluid is supplied slowly from a buffer tube to the main tube, and refills the void in the main tube, when the fluid level in the main tube reaches a predetermined level, the refilling process stops;

performing a suck-back process, wherein the remaining fluid in the main tube is suck backed to a certain level.

2. The method of claim 1, wherein the method of the dispense system further comprises a suck back valve and a main valve connected to the main tube, wherein the main tube and the suck back valve are both connected to the fluid supplier, and one end of the main tube is connected to the nozzle.

3. The method of claim 2, wherein the suck back valve and the main valve controls flow rate and flow volume of the stream fluid.

4. The method of claim 1, wherein the buffer tube further comprises a buffer valve and a pin hole, and both ends of the buffer tube are connected to the main tube, wherein the pin hole is located at an output of the buffer tube.

5. The method of claim 4, wherein a diameter of the pin hole is approximately between 0.4 mm to 0.8 mm, but preferably is 0.6 mm.

6. The method of claim 5, wherein the fluid comprises a developer.

7. The method of claim 6, wherein a flowing speed of the fluid in the buffer tube is much slower than a flowing speed of the fluid in the main tube.

8. The method of claim 1, wherein the step of performing the suck-back process has a flow rate of sucking back the fluid that is slower than a flow rate under a capillarity effect.

9. The method of claim 1, wherein in the step of performing the suck-back process, the remaining fluid in the main tube is suck backed to approximately between 3 ml to 6 ml.

* * * * *